(12) United States Patent
Kadota et al.

(10) Patent No.: US 7,839,942 B2
(45) Date of Patent: Nov. 23, 2010

(54) DEMODULATOR, RECEIVER, AND DEMODULATION METHOD

(75) Inventors: Yukihiro Kadota, Tokyo (JP); Mitsuru Takeuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 546 days.

(21) Appl. No.: 11/662,606

(22) PCT Filed: May 10, 2006

(86) PCT No.: PCT/JP2006/309371

§ 371 (c)(1),
(2), (4) Date: Dec. 13, 2007

(87) PCT Pub. No.: WO2006/123557

PCT Pub. Date: Nov. 23, 2006

(65) Prior Publication Data

US 2009/0041167 A1    Feb. 12, 2009

(30) Foreign Application Priority Data

May 16, 2005   (JP)  ............................. 2005-142278

(51) Int. Cl.
*H04K 1/10* (2006.01)
*H04L 27/06* (2006.01)
*H04L 27/08* (2006.01)
(52) U.S. Cl. .................. 375/260; 375/343; 375/345
(58) Field of Classification Search ................. 375/260, 375/343, 345, 347, 354
See application file for complete search history.

(56) References Cited

U.S. PATENT DOCUMENTS

| 6,647,025 | B1 | 11/2003 | Sudo | |
|---|---|---|---|---|
| 2004/0005022 | A1* | 1/2004 | Zhu et al. | 375/365 |
| 2009/0110033 | A1* | 4/2009 | Shattil | 375/141 |

FOREIGN PATENT DOCUMENTS

| JP | 2000-174726 A | 6/2000 |
|---|---|---|
| JP | 2000-224132 A | 8/2000 |
| JP | 2001-168833 A | 6/2001 |
| JP | 2001-345778 A | 12/2001 |
| JP | 2003-51768 A | 2/2003 |
| JP | 2003-60605 A | 2/2003 |
| JP | 2003-143105 A | 5/2003 |
| JP | 2003-229833 A | 8/2003 |
| JP | 2004-135120 A | 4/2004 |
| JP | 2004-172716 A | 6/2004 |

* cited by examiner

*Primary Examiner*—Don N Vo
(74) *Attorney, Agent, or Firm*—Birch, Stewart, Kolasch & Birch, LLP (57) ABSTRACT

In an OFDM receiver with a diversity configuration having a plurality of demodulation modules, to perform FFT window position recovery and clock recovery, the gain values calculated by the AGC units (16, 26) provided in the demodulation modules for adjusting the level of the received signal are supplied to a correlation combiner (35); the correlation combiner (35) multiplies the correlation signals supplied from the correlation detectors (17, 27) in the demodulation modules by coefficients calculated from the gain values, then adds the products to generate a combined correlation signal and supplies it to an FFT window position recovery unit (32) and a clock error detector (33). FFT window position recovery and clock recovery can thus be performed properly without depending on any one demodulation module.

22 Claims, 8 Drawing Sheets

DEMODULATOR, RECEIVER, AND DEMODULATION METHOD

FIELD OF THE INVENTION

The present invention relates to a demodulator suitable for an OFDM receiver that receives an OFDM signal in which a symbol interval consists of a guard interval and a valid symbol interval, the trailing part of the valid symbol interval being copied cyclically into the guard interval; more particularly, the invention relates to techniques for clock recovery and fast Fourier transform window position recovery in a diversity receiver. The invention also relates to a receiver equipped with the above demodulator, and to a demodulation method.

BACKGROUND ART

In an OFDM receiver with a conventional diversity configuration, one of a plurality of demodulation modules is a master module that solely performs clock recovery and fast Fourier transform window position recovery, the results thereof being used by the other modules as well, so if clock recovery or fast Fourier transform window position recovery falters because of, for example, a drop in the received signal level in the master module, the other modules are also affected and demodulation performance suffers greatly.

A countermeasure is to generate correlation waveform signals for use in clock recovery or fast Fourier transform window position recovery in all demodulation modules, combine the correlation waveform signals of the demodulation modules or select one of them, and perform clock recovery or fast Fourier transform window position recovery from the result, so that these processes do not depend on just one module (see, for example, Patent Document 1).

Combining the respective OFDM signals themselves received through the branches, generating a corresponding correlation waveform signal, and using it in clock recovery or fast Fourier transform window position recovery could also be considered, but with this approach, in order to combine the OFDM signals, it would be necessary to match phases across the branches, which would require a separate circuit to detect phase differences between the respective OFDM signals received through the branches and another separate circuit to correct the phase differences. When, however, the correlation waveform signals are combined, a configuration that does not require detection and correction of the phase differences among the respective signals of the branches is made possible.

Patent Document 1: Japanese Patent Application Publication No. 2001-168833

DISCLOSURE OF THE INVENTION

Problems to be Solved by the Invention

If, however, each demodulation module has AGC (automatic gain control) means for adjusting the magnitude of the received signal to a certain level, and the correlation waveforms are combined by using a complex baseband OFDM signal that has undergone gain adjustment by the AGC means, then in the combining or selection of correlation waveforms, if a configuration that combines by multiplying by a value proportional to the peak value of the correlation waveform signal in each demodulation module or a configuration that selects a signal with a large peak value is adopted (see Patent Document 1), it will be affected by level adjustment by AGC, possibly leading to large peak values in correlation waveforms of signals with small received power etc. and a large proportion of noise, and when a combined correlation waveform combined by multiplying these types of correlation waveforms by a peak value or a selected correlation waveform selected because of its peak value has been used for clock recovery or fast Fourier transform window position recovery, performance has suffered greatly.

Means of Solution of the Problems

The present invention provides a demodulator comprising a plurality of demodulation modules, each receiving an OFDM signal in which a symbol interval consists of a guard interval and a valid symbol interval and demodulating the OFDM signal to extract symbol data, and a combining means for combining the demodulated data output from the plurality of demodulation modules and generating combined demodulated data, wherein each of the plurality of the demodulation modules comprises an AGC means for generating an AGC control signal for adjusting the magnitude of the received signal to a specific level, and a correlation detection means for detecting a correlation between a complex-valued baseband OFDM signal that has been gain-adjusted by the AGC means and a signal obtained by delaying the complex-valued baseband OFDM signal by one valid symbol interval to generate a correlation waveform signal representing the detected correlation, the demodulator further comprising a correlation combining means that generates a combined correlation signal by combining the correlation waveform signals output from the correlation detection means in the plurality of demodulation modules, the correlation combining means multiplying the correlation waveform signals by coefficients calculated from gain values represented by the respective AGC control signals output from the AGC means in the plurality of demodulation modules and adding the resulting products together to generate the combined correlation signal.

Effect of the Invention

The present invention demonstrates an effect in which adverse effects of a correlation waveform that has a large proportion of noise components due to the small reception signal power thereof or the like can be suppressed, whereby the clock recovery and the fast Fourier transform window position recovery can accurately be performed.

EXPLANATION OF REFERENCE CHARACTERS 10, 20 demodulation modules, 11, 21 tuners, 12, 22 A/D converters, 13, 23 IQ demodulators, 14, 24 FFT units, 15, 25 demodulators, 16, 26 AGC units, 17, 27 correlation detectors, 18, 28 C/N detectors, 19, 29 synchronization acquisition decision units, 31 combiner, 32 FFT window position recovery unit, 33 clock error detector, 34 clock recovery unit, 35, 36, 37 correlation combiners, 101, 102, 111, 112, 121, 122, 131, 132, 141, 142, 151, 152, 161, 162 multipliers, 103, 104 reciprocal value calculators, 105, 115, 125, 135, 145, 155, 165, 175 adders, 113, 123, 143, 153, 163 coefficient determiners, 133, 134 proportional value calculators.

BEST MODE OF PRACTICING THE INVENTION

First Embodiment

Figure 1:
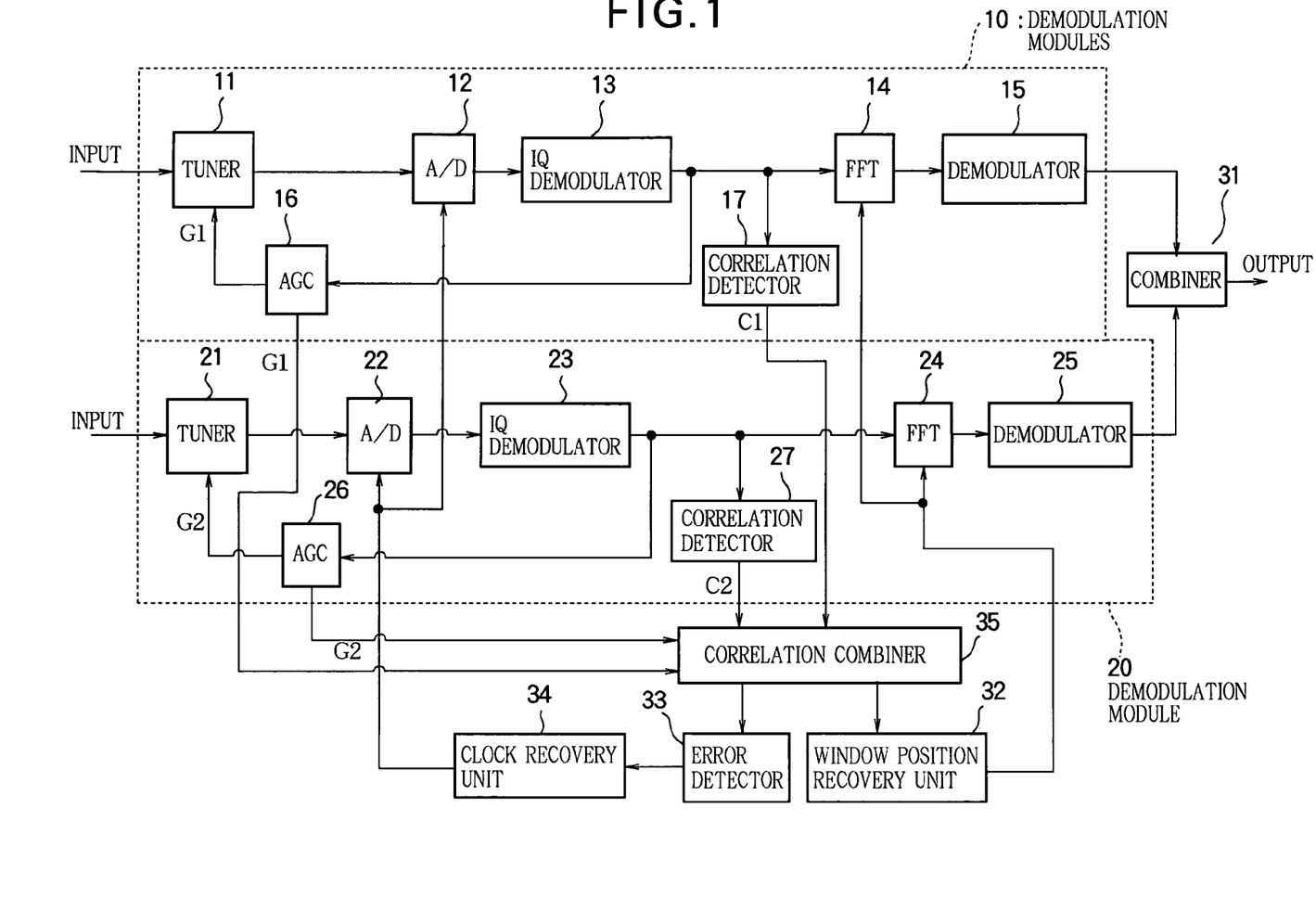
FIG. 1 is a block diagram showing a demodulator in a first embodiment of this invention.

FIG. 1 is a block diagram showing the structure of a demodulator in a first embodiment of this invention, which is configured for diversity reception with two demodulation modules (a first demodulation module and a second demodulation module) 10, 20. The received signals are input in parallel to the tuners 11, 21 in the demodulation modules 10, 20. The input signals are converted by the tuners 11, 21 to the intermediate frequency band or IF band, then supplied to A/D converters 12, 22. The A/D converters 12, 22 generate output signals in synchronization with a clock signal supplied from a clock recovery unit 34, described below; they convert the outputs of the tuners 11, 21 to digital signals and supply the resulting values to IQ demodulators 13, 23. The input data are converted in the IQ demodulators 13, 23 to complex-valued baseband signals which are supplied to fast Fourier transform (FFT) units 14, 24. Operating according to a window position signal from an FFT window position recovery unit 32, the FFT units 14, 24 each capture data at each window position, perform a fast Fourier transform for modulating each subcarrier in the OFDM signal to extract the data, and supply the resulting values to demodulators 15, 25. The demodulators 15, 25 demodulate the outputs of the FFT units 14, 24, to extract the symbol data carried on the subcarriers and generate receive data, which are supplied as the outputs of the modules to a combiner 31. The receive data supplied from the modules are combined in the combiner 31, which outputs the final receive data.

In this configuration, the complex-valued baseband signals obtained by the IQ demodulators 13, 23 are also supplied to AGC (automatic gain control) units 16, 26. The AGC units 16, 26 calculate AGC control signals representing gain values for adjusting the receive signals to prescribed levels and supply them to the tuners 11, 21. The tuners 11, 21 adjust and output the levels of the IF signals according to the AGC control signals supplied from the AGC units 16, 26. The signals downstream of the tuners 11, 21 in this configuration have all been level-adjusted by AGC.

The complex-valued baseband signals obtained by the IQ demodulators 13, 23 are also supplied to correlation detectors 17, 27, which detect correlation waveforms C1, C2 of the complex-valued baseband signals (outputs of the IQ demodulators 13, 23) and signals obtained by delaying the complex-valued baseband signals by one valid symbol interval, and supply these results (signals representing the detected correlation waveforms) to a correlation combiner 35.

The correlation combiner 35 receives, in addition to the correlation waveforms C1, C2 output from the correlation detectors 17, 27, the AGC control signals calculated in the AGC units 16, 26.

The correlation combiner 35 calculates values inversely proportional to the gain values represented by the AGC control signals supplied from the AGC units 16, 26 in each module, multiplies the correlation waveforms C1, C2 supplied from the correlation detectors 17, 27 in each module by the calculated values, and adds the correlation waveforms obtained as a result of these multiplication operations, thereby combining the waveforms.

Figure 2:
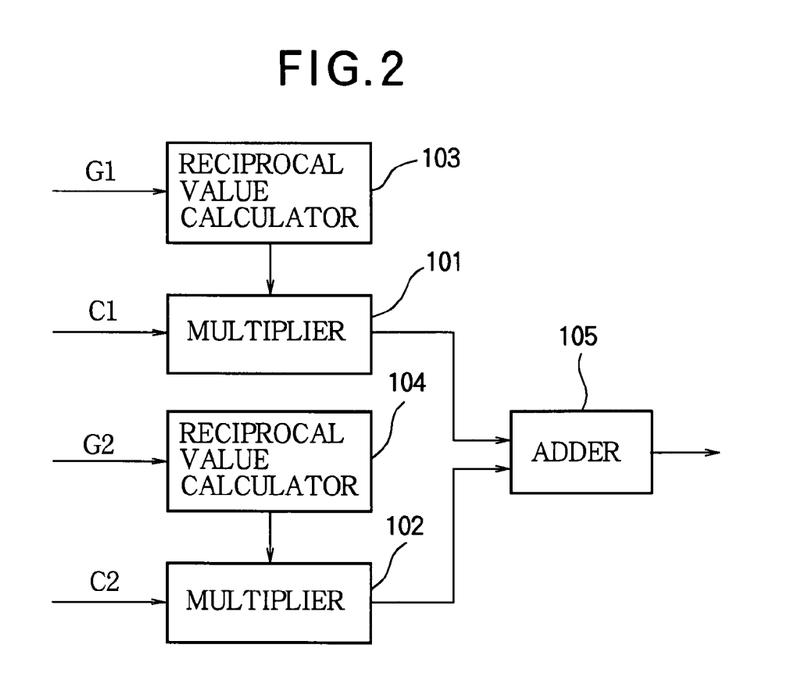
FIG. 2 is a block diagram showing an example of the correlation combiner used in the first embodiment.

The correlation combiner 35 comprises, for example, first and second multipliers 101, 102, first and second reciprocal value calculators 103, 104, and an adder 105 as shown in FIG. 2. The first reciprocal value calculator 103 calculates a value inversely proportional to the gain value represented by the AGC control signal supplied from AGC unit 16. The second reciprocal value calculator 104 calculates a value inversely proportional to the gain value represented by the AGC control signal supplied from AGC unit 26. The first multiplier 101 multiplies the correlation waveform C1 supplied from correlation detector 17 by the value calculated in first reciprocal value calculator 103. The second multiplier 102 multiplies the correlation waveform C2 supplied from correlation detector 27 by the value calculated in second reciprocal value calculator 104. The adder 105 adds the multiplication results obtained in the first and second multipliers 101, 102.

The correlation waveform combined by the correlation combiner 35 is supplied to the FFT window position recovery unit 32 and a clock error detector 33. From the combined correlation waveform supplied from the correlation combiner 35, the clock error detector 33 detects clock frequency and phase error and supplies an error signal representing the error to the clock recovery unit 34. Using this error signal, the clock recovery unit 34 outputs a clock signal, the frequency and phase of which are controlled so as to reduce the error, to the A/D converters 12, 22 and other circuits requiring clock synchronization.

The clock recovery unit 34 may include, for example, an oscillator, the frequency of which is changed according to the error signal from the clock error detector 33, or it may receive a clock signal from external clock signal supply means (not shown), adjust its frequency by, for example, skipping pulse edges, and output the adjusted clock signal.

The above clock error detector 33 and clock recovery unit 34 constitute a clock generating means for producing the clock signal supplied to the A/D converters 12, 22 and other circuits.

The FFT window position recovery unit 32 detects an FFT window position (a common window position shared by the plurality of demodulation modules) from the supplied combined correlation waveform and supplies the window position signal to the FFT units 14, 24, thereby performing FFT window position control.

The present embodiment is configured to use the correlation waveforms of the OFDM signal to carry out clock recovery, but instead of using a separate correlation waveform in each of the plurality of demodulation modules, it combines the correlation waveforms in the plurality of demodulation modules and uses the combined waveform to control a clock recovery means that is shared by the plurality of demodulation modules.

Two demodulation modules (10, 20) are provided in the above example, but the number of demodulation modules may be three or more. In this case as well, the correlation combiner 35 can be configured as above. Generally speaking, when there are n.demodulation modules (where n is an integer equal to or greater than two), the correlation combiner 35 comprises first to n-th multipliers corresponding to respective demodulation modules, first to n-th reciprocal value calculators corresponding to the respective demodulation modules, and an adder. The first to n-th reciprocal value calculators calculate values inversely proportional to the gain values represented by the AGC control signals supplied from the AGC units in the corresponding demodulation modules. The first to n-th multipliers multiply the correlation waveforms supplied from the correlation detectors in the respective demodulation modules by the values calculated in the corresponding reciprocal value calculators. The adder sums the outputs of the first to n-th multipliers and outputs the sum as a combined correlation waveform.

Alternatively, in place of the above correlation combiner 35, another type of correlation combiner 35 may be used in which the correlation waveforms are combined as follows: the coefficient of the correlation waveform output from the demodulation module that outputs the minimum value among the gain values represented by the AGC control signals supplied from the AGC units 16, 26 in each module is set to '1'; the coefficient of the correlation waveform output from the other demodulation module is set to '0'; the correlation waveforms C1, C2 supplied from the correlation detectors 17, 27 in the demodulation modules are multiplied by these set coefficient values; and the correlation waveforms obtained from these multiplication operations are added together.

Figure 3:
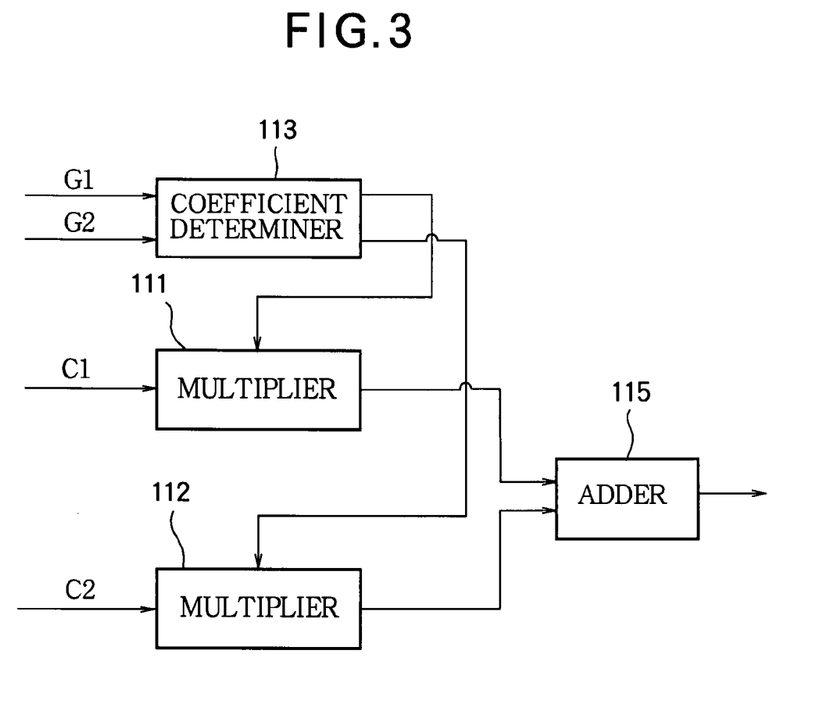
FIG. 3 is a block diagram showing another example of the correlation combiner used in the first embodiment.

A specific example of this type of correlation combiner is shown in FIG. 3. The correlation combiner shown in FIG. 3 comprises multipliers 111, 112 corresponding to the demodulation modules 10, 20, a coefficient determiner 113, and an adder 115.

The multipliers 111, 112 receive the correlation waveforms C1, C2 from the correlation detectors 17, 27 in the demodulation modules 10, 20, respectively, and multiply these waveforms C1, C2 by corresponding coefficients supplied from the coefficient determiner 113. The coefficient determiner 113 receives the AGC control signals G1, G2 from the AGC units 16, 26 in the demodulation modules 10, 20, sets the coefficient used for multiplication in the multiplier (one of multipliers 111 and 112) that receives the output of the correlation detector in the demodulation module including the AGC unit that outputs the minimum one of the gain values represented by the AGC control signals G1, G2 to '1', and sets the coefficient used for multiplication in the other multiplier (the other one of multipliers 111 and 112) to '0'. The multipliers 111, 112 carry out multiplication using the coefficients set by the coefficient determiner 113. The adder 115 adds the outputs of the multipliers 111, 112 together and outputs the sum as a combined correlation waveform. The above process is equivalent to selecting one of the correlation waveforms output from the plurality of demodulation modules.

Two demodulation modules (10, 20) are provided in the above example, but the number of demodulation modules may be three or more. In this case as well, the correlation combiner 35 can be configured as above. Generally speaking, when there are n demodulation modules (where n is an integer equal to or greater than two), the correlation combiner 35 comprises first to n-th multipliers corresponding to respective demodulation modules, a coefficient determiner, and an adder. The first to n-th multipliers receive the correlation waveforms from the correlation detectors in the respective demodulation modules and multiply these waveforms by the coefficients supplied from the coefficient determiner. The coefficient determiner receives the AGC control signals from the ACG units in the demodulation modules, sets the coefficient used for multiplication in the multiplier that receives the output of the correlation detector in the demodulation module including the AGC unit that outputs the minimum one of the gain values represented by the AGC control signals to '1', and sets the coefficients used for multiplication in the other multipliers to '0'. The first to n-th multipliers carry out multiplication using the coefficients set by the coefficient determiner. The adder sums the outputs of the first to n-th multipliers and outputs the sum as a combined correlation waveform.

Alternatively, in place of the above correlation combiner 35, still another type of correlation combiner 35 may be used in which the correlation waveforms are combined as follows: the gain values represented by the AGC control signals supplied from the AGC units 16, 26 in the demodulation modules are compared with a predetermined threshold value; the coefficient for the correlation waveform from each demodulation module that outputs a value equal to or less than the threshold value is set to the reciprocal of the number of modules that output values equal to or less than the threshold value and the coefficient for the correlation waveform output from each demodulation module that outputs a value greater than the threshold value is set to '0', unless all the demodulation modules output values greater than the threshold value, in which case the coefficients for the correlation waveforms output from all the demodulation modules are set to the reciprocal of the total number of demodulation modules; the correlation waveforms supplied from the correlation detectors 17, 27 in each module are multiplied by these set coefficient values; and the correlation waveforms obtained as a result of these multiplication operations are added together.

Figure 4:
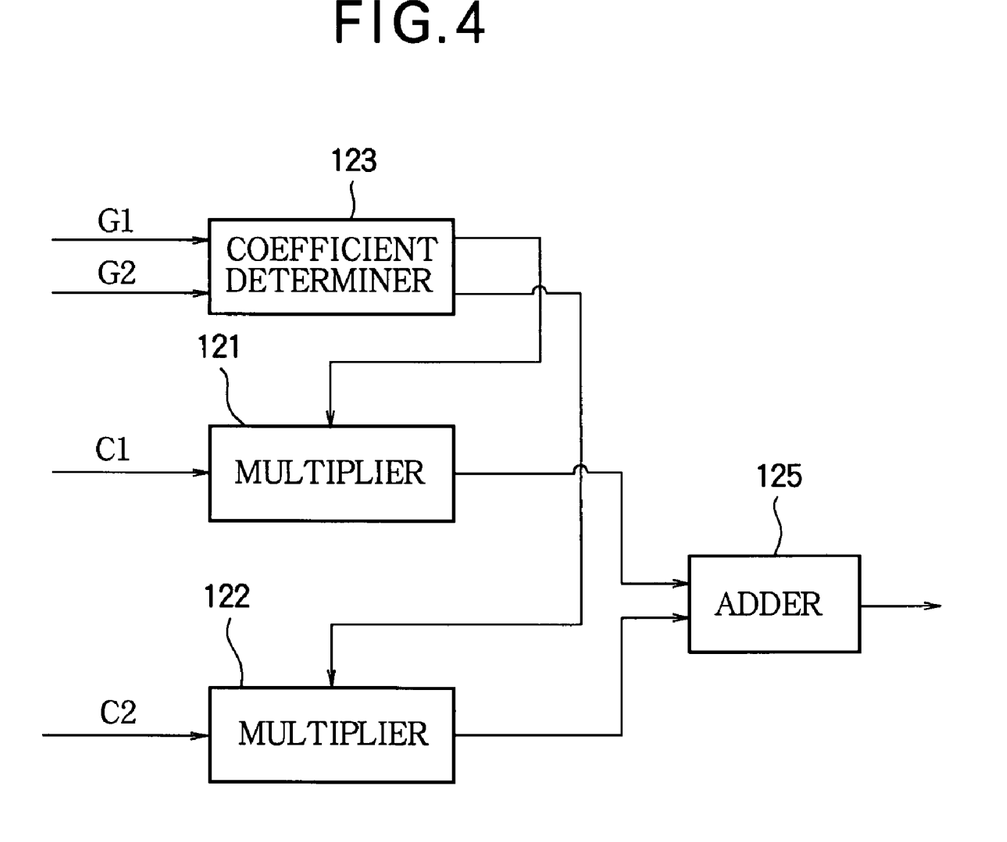
FIG. 4 is a block diagram showing yet another example of the correlation combiner used in the first embodiment.

A specific example of this type of correlation combiner 35 is shown in FIG. 4. The correlation combiner 35 shown in FIG. 4 comprises multipliers 121, 122 corresponding to the demodulation modules 10, 20, a coefficient determiner 123, and an adder 125.

The multipliers 121, 122 receive the correlation waveforms C1, C2 from the correlation detectors 17, 27 in the demodulation modules 10, 20, respectively, and multiply these waveforms C1, C2 by corresponding coefficients supplied from the coefficient determiner 123. The coefficient determiner 123 receives the AGC control signals G1, G2 from the AGC units 16, 26 in the demodulation modules 10, 20 and determines whether the gain values represented by the AGC control signals G1, G2 are less than or equal to a predetermined threshold value. If both the gain values are less than or equal to the threshold value, the coefficients used in the multipliers 121, 122 are both set to ½. If one gain value (for example, the gain value represented by AGC control signal G1) out of the gain values represented by the AGC control signals G1 and G2, is less than or equal to the threshold value and the other gain value is greater than the threshold value, the coefficient used in the multiplier (121) corresponding to the AGC unit that outputs the AGC control signal representing the one gain value is set to '1' and the coefficient used in the other multiplier (122) is set to '0'. If the gain values represented by the AGC control signals G1, G2 are both greater than the threshold value, the coefficients used in the multipliers 121, 122 are both set to ½.

The multipliers 121, 122 carry out multiplication using the coefficients set by the coefficient determiner 123. The adder 125 adds the outputs of the multipliers 121, 122 together and outputs the sum as a combined correlation waveform.

Two demodulation modules (10, 20) are provided in the above example, but the number of demodulation modules may be three or more. In this case as well, the correlation combiner 35 can be configured as above. Generally speaking, when there are n demodulation modules (where n is an integer equal to or greater than two), the correlation combiner 35 comprises first to n-th multipliers corresponding to respective demodulation modules, a coefficient determiner, and an adder. The first to n-th multipliers receive the correlation waveforms from the correlation detectors in the respective demodulation modules and multiply these waveforms by the coefficients supplied from the coefficient determiner. The coefficient determiner receives the AGC control signals from the ACG units in the demodulation modules, determines whether the gain values represented by these AGC control signals are less than or equal to a predetermined threshold value, and obtains the number m of demodulation modules in which the gain values represented by the AGC control signals are less than or equal to the threshold value. If the number m is greater than or equal to one, the coefficients used in the multipliers corresponding to the demodulation modules in which the gain values represented by the AGC control signals are less than or equal to the threshold value are set to 1/m, and the coefficients used in the multipliers corresponding to the demodulation modules in which the gain values represented by the AGC control signals are greater than the threshold value are set to '0'. If the number m is zero, then the coefficients used in the first to n-th multipliers are all set to 1/n.

The first to n-th multipliers carry out multiplication using the coefficients set by the coefficient determiner. The adder sums the outputs of the first to n-th multipliers and outputs the sum as a combined correlation waveform.

In the above example, whether the gain values represented by the AGC control signals are less than or equal to a predetermined threshold value or not is determined. Alternatively, whether some other condition is satisfied may be determined, and coefficients may be determined according to the determination result. The coefficients used in the multipliers may also be set to positive non-zero values other than '1/m' and '1/n'.

Second Embodiment

Figure 5:
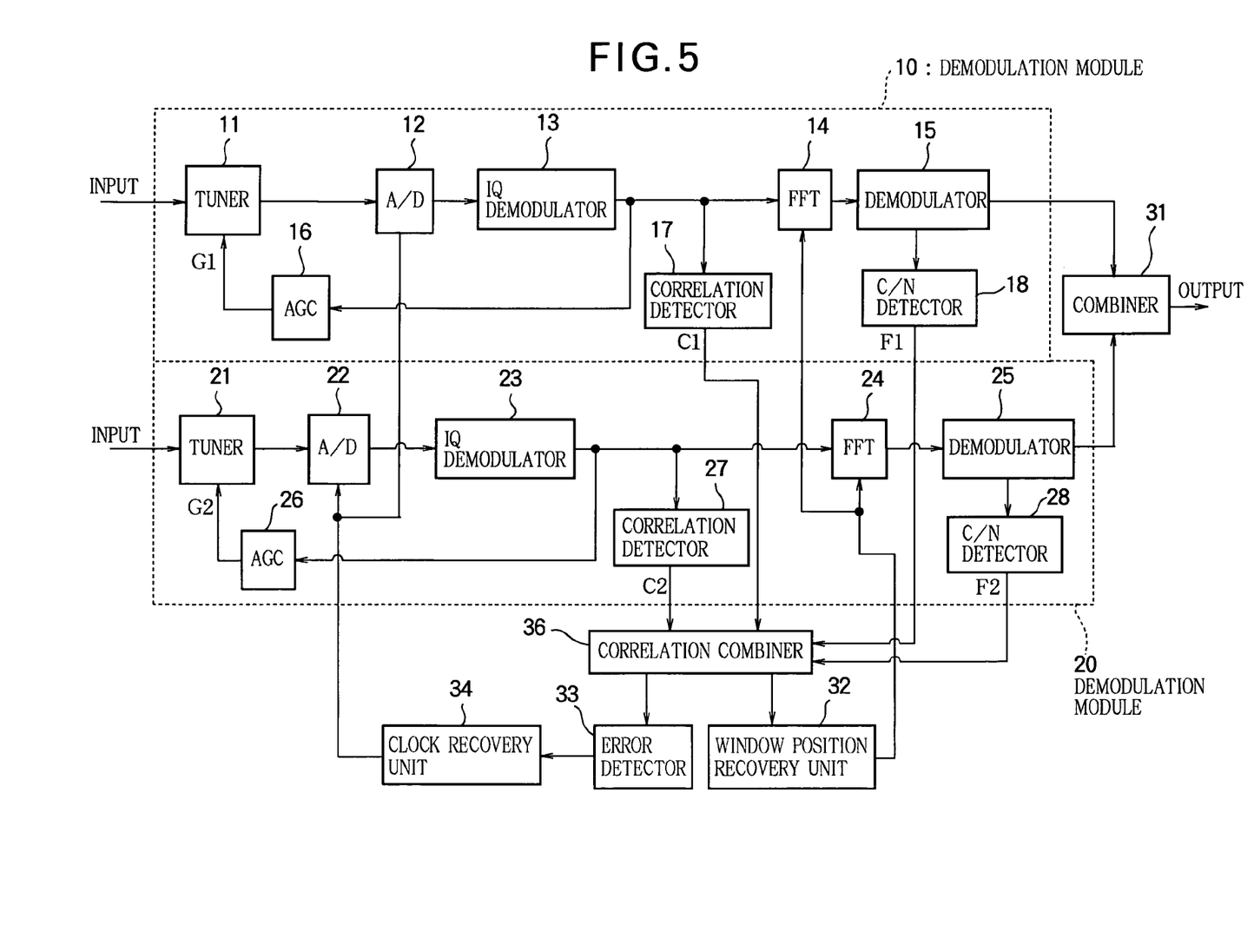
FIG. 5 is a block diagram showing a demodulator in a second embodiment of this invention.

FIG. 5 is a block diagram showing the structure of a demodulator in a second embodiment of this invention, which is configured for diversity reception with two demodulation modules 10, 20 as in the first embodiment.

The structure of the demodulator shown in FIG. 5 is generally similar to the structure shown in FIG. 1, but is equipped with C/N detectors 18, 28 for detecting a C/N value (signal power vs. error signal power ratio) which is the power ratio between the signal actually demodulated and the error of the actually demodulated signal with respect to the originally expected demodulated signal in each module. The C/N values F1, F2 calculated in the C/N detectors 18, 28 are supplied to a correlation combiner 36 together with the correlation waveforms C1, C2 detected by the correlation detectors 17, 27.

The correlation combiner 36 calculates values proportional to the C/N values F1, F2 supplied from the C/N detectors 18, 28 in each module, multiplies the correlation waveforms C1, C2 supplied from the correlation detectors 17, 27 in each module by the calculated values, and adds the correlation waveforms obtained as a result of these multiplication operations, thereby combining the waveforms. The combined correlation waveform is supplied to the clock error detector 33 and FFT window position recovery unit 32, which carry out FFT window position recovery and clock recovery.

Figure 6:
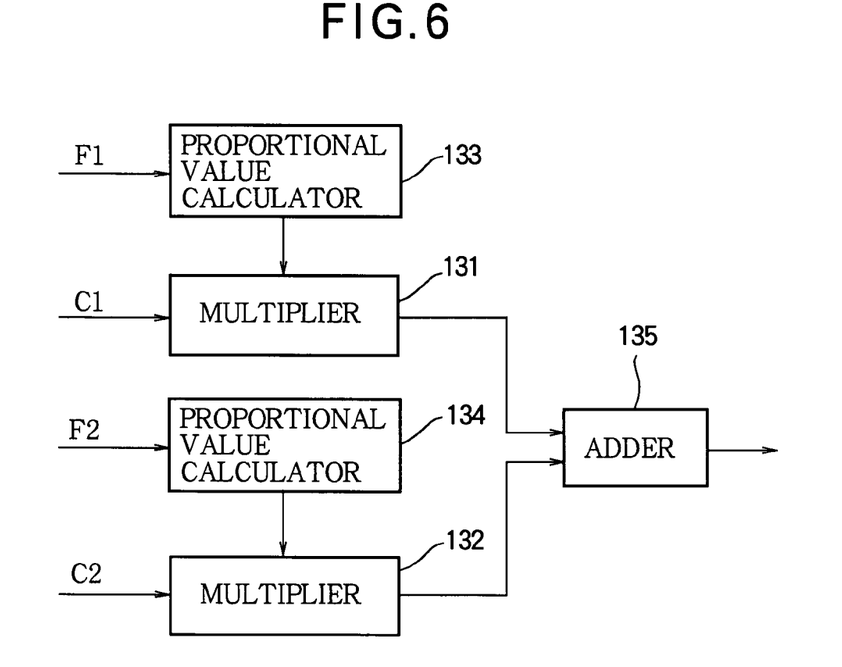
FIG. 6 is a block diagram showing an example of the correlation combiner used in the second embodiment.

The correlation combiner 36 comprises, for example, first and second multipliers 131, 132, first and second proportional value calculators 133, 134, and an adder 135 as shown in FIG. 6. The first proportional value calculator 133 calculates a value proportional to the C/N value F1 supplied from C/N detector 18. The second proportional value calculator 134 calculates a value proportional to the C/N value F2 supplied from C/N detector 28. The first multiplier 131 multiplies the correlation waveform C1 supplied from correlation detector 17 by the value calculated in the first proportional value calculator 133. The second multiplier 132 multiplies the correlation waveform C2 supplied from correlation detector 27 by the value calculated in the second proportional value calculator 134. The adder 135 adds the multiplication results obtained in the first and second multipliers 131, 132.

Two demodulation modules (10, 20) are provided in the above example, but the number of demodulation modules may be three or more. In this case as well, the correlation combiner 36 can be configured as above. Generally speaking, when there are n demodulation modules (where n is an integer equal to or greater than two), the correlation combiner 36 comprises first to n-th multipliers corresponding to respective demodulation modules, first to n-th proportional value calculators corresponding to respective demodulation modules, and an adder. The first to n-th proportional value calculators calculate values proportional to the C/N values supplied from the C/N detectors in the demodulation modules. The first to n-th multipliers multiply the correlation waveforms supplied from the correlation detectors in the respective demodulation modules by the values calculated in the corresponding proportional value calculators. The adder sums the outputs of the first to n-th multipliers and outputs the sum as a combined correlation waveform.

In another example of correlation combiner 36, the correlation waveforms are combined as follows: the coefficient of the correlation waveform output from the demodulation module that outputs the maximum value among the C/N values supplied from the C/N detectors 18, 28 in each module is set to '1'; the coefficient of the correlation waveform output from the other demodulation module is set to '0'; the correlation waveforms supplied from the correlation detectors 17, 27 in the demodulation modules are multiplied by these set coefficient values; and the correlation waveforms obtained from these multiplication operations are added together. The above process is equivalent to selecting one of the correlation waveforms output from the demodulation modules.

Figure 7:
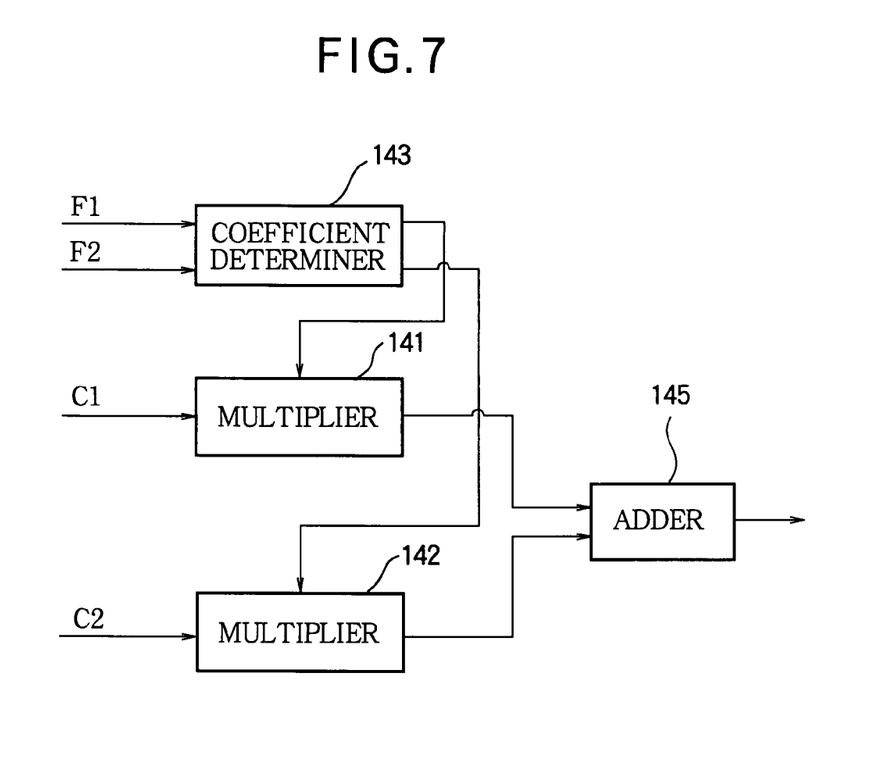
FIG. 7 is a block diagram showing another example of the correlation combiner used in the second embodiment.

A specific example of this type of correlation combiner is shown in FIG. 7. The correlation combiner shown in FIG. 7 comprises multipliers 141, 142 corresponding to the demodulation modules 10, 20, a coefficient determiner 143, and an adder 145.

The multipliers 141, 142 receive the correlation waveforms C1, C2 from the correlation detectors 17, 27 in the demodulation modules 10, 20 and multiply these waveforms C1, C2 by coefficients supplied from the coefficient determiner 143. The coefficient determiner 143 receives the C/N detection signals F1, F2 from the C/N detectors 18, 28 in the demodulation modules 10, 20, sets the coefficient used for multiplication in the multiplier (one of multipliers 141 and 142) that receives the output of the correlation detector in the demodulation module including the C/N detector that outputs the maximum one of the C/N values represented by the C/N detection signals F1, F2 to '1', and sets the coefficient used for multiplication in the other multiplier (the other one of multipliers 141 and 142) to '0'. The multipliers 141, 142 carry out multiplication using the coefficients set by the coefficient determiner 143. The adder 145 adds the outputs of the multipliers 141, 142 together and outputs the sum as a combined correlation waveform. The above process is equivalent to selecting one of the correlation waveforms output from the plurality of demodulation modules.

Two demodulation modules (10, 20) are provided in the above example, but the number of demodulation modules may be three or more. In this case as well, the correlation combiner 36 can be configured as above. Generally speaking, when there are n demodulation modules (where n is an integer equal to or greater than two), the correlation combiner 36 comprises first to n-th multipliers corresponding to respective demodulation modules, a coefficient determiner, and an adder. The first to n-th multipliers receive the correlation waveforms from the correlation detectors in the respective demodulation modules and multiply these waveforms by the coefficients supplied from the coefficient determiner. The coefficient determiner receives the C/N values from the C/N detectors in the demodulation modules, sets the coefficient used for multiplication in the multiplier that receives the output of the correlation detector in the demodulation module including the C/N detector that outputs the maximum one of the C/N values to '1', and sets the coefficients used for multiplication in the other multipliers to '0'. The first to n-th multipliers carry out multiplication using the coefficients set by the coefficient determiner. The adder sums the outputs of the first to n-th multipliers and outputs the sum as a combined correlation waveform.

In still another example of correlation combiner 36, the correlation waveforms are combined as follows: the C/N values supplied from the C/N detectors 18, 28 in the demodulation modules are compared with a predetermined threshold value; the coefficient for the correlation waveform from each demodulation module that outputs a value equal to or greater than the threshold value is set to the reciprocal of the number of modules that output values equal to or greater than the threshold value and the coefficient for the correlation waveform output from each demodulation module that outputs a value less than the threshold value is set to '0', unless all the demodulation modules output values less than the threshold value, in which case the coefficients for the correlation waveforms output from all the demodulation modules are set to the reciprocal of the total number of demodulation modules; the correlation waveforms supplied from the correlation detectors 17, 27 in each module are multiplied by these set coefficient values; and the correlation waveforms obtained as a result of these multiplication operations are added together.

Figure 8:
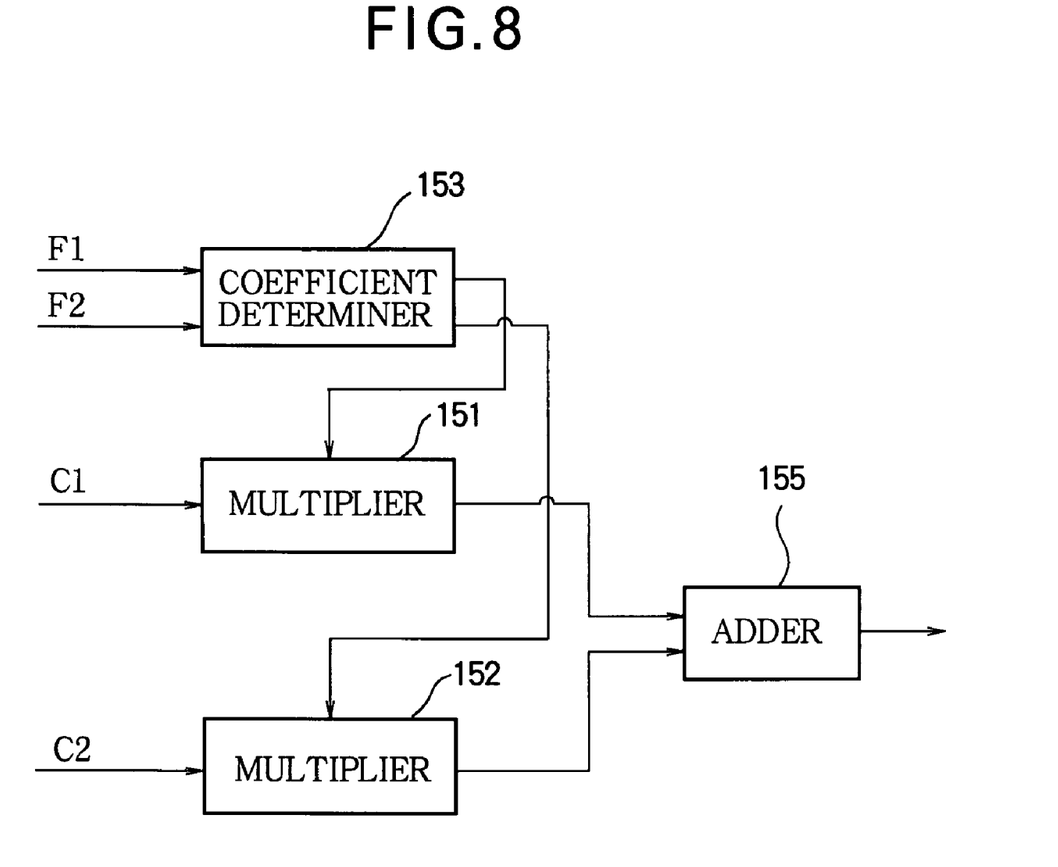
FIG. 8 is a block diagram showing yet another example of the correlation combiner used in the second embodiment.

A specific example of this type of correlation combiner 36 is shown in FIG. 8. The correlation combiner 36 shown in FIG. 8 comprises multipliers 151, 152 corresponding to the demodulation modules 10, 20, a coefficient determiner 153, and an adder 155.

The multipliers 151, 152 receive the correlation waveforms C1, C2 from the correlation detectors 17, 27 in the demodulation modules 10, 20 and multiply these waveforms C1, C2 by coefficients supplied from the coefficient determiner 153. The coefficient determiner 153 receives the C/N detection values F1, F2 from the C/N detectors 18, 28 in the demodulation modules 10, 20 and determines whether the C/N detection values F1, F2 are less than or equal to a predetermined threshold value. If both C/N detection values F1, F2 are greater than or equal to the threshold value, the coefficients used in the multipliers 151, 152 are both set to ½. If one C/N value (for example, C/N value F1) is greater than or equal to the threshold value and the other C/N value is less than the threshold value, the coefficient used in the multiplier (151) corresponding to the C/N detector with the greater C/N value is set to '1' and the coefficient used in the other multiplier (152) is set to '0'. If the C/N values F1, F2 are both less than the threshold value, the coefficients used in the multipliers 151, 152 are both set to ½.

The multipliers 151, 152 carry out multiplication using the coefficients set by the coefficient determiner 153. The adder 155 adds the outputs of the multipliers 151, 152 together and outputs the sum as a combined correlation waveform.

Two demodulation modules (10, 20) are provided in the above example, but the number of demodulation modules may be three or more. In this case as well, the correlation combiner 36 can be configured as above. Generally speaking, when there are n demodulation modules (where n is an integer equal to or greater than two), the correlation combiner 36 comprises first to n-th multipliers corresponding to respective demodulation modules, a coefficient determiner, and an adder. The first to n-th multipliers receive the correlation waveforms from the correlation detectors in the respective demodulation modules and multiply these waveforms by the coefficients supplied from the coefficient determiner. The coefficient determiner receives the C/N detection values from the C/N detectors in the demodulation modules, determines whether the C/N detection values are greater than or equal to a predetermined threshold value, and obtains the number m of demodulation modules in which the C/N detection values are greater than or equal to the threshold value. If the number m is greater than or equal to one, the coefficients used in the multipliers corresponding to the demodulation modules in which the C/N values are greater than or equal to the threshold value are set to 1/m, and the coefficients used in the multipliers corresponding to the demodulation modules in which the C/N values are less than the threshold value are set to '0'. If the number m is zero, then the coefficients used in the first to n-th multipliers are all set to 1/n.

The first to n-th multipliers carry out multiplication using the coefficients set by the coefficient determiner. The adder sums the outputs of the first to n-th multipliers and outputs the sum as a combined correlation waveform.

In the above example, whether the C/N values are greater than or equal to a predetermined threshold value or not is determined. Alternatively, whether some other condition is satisfied may be determined, and coefficients may be determined according to the result. The coefficients used in the multipliers may also be set to positive non-zero values other than '1/m' and '1/n'.

Third Embodiment

Figure 9:
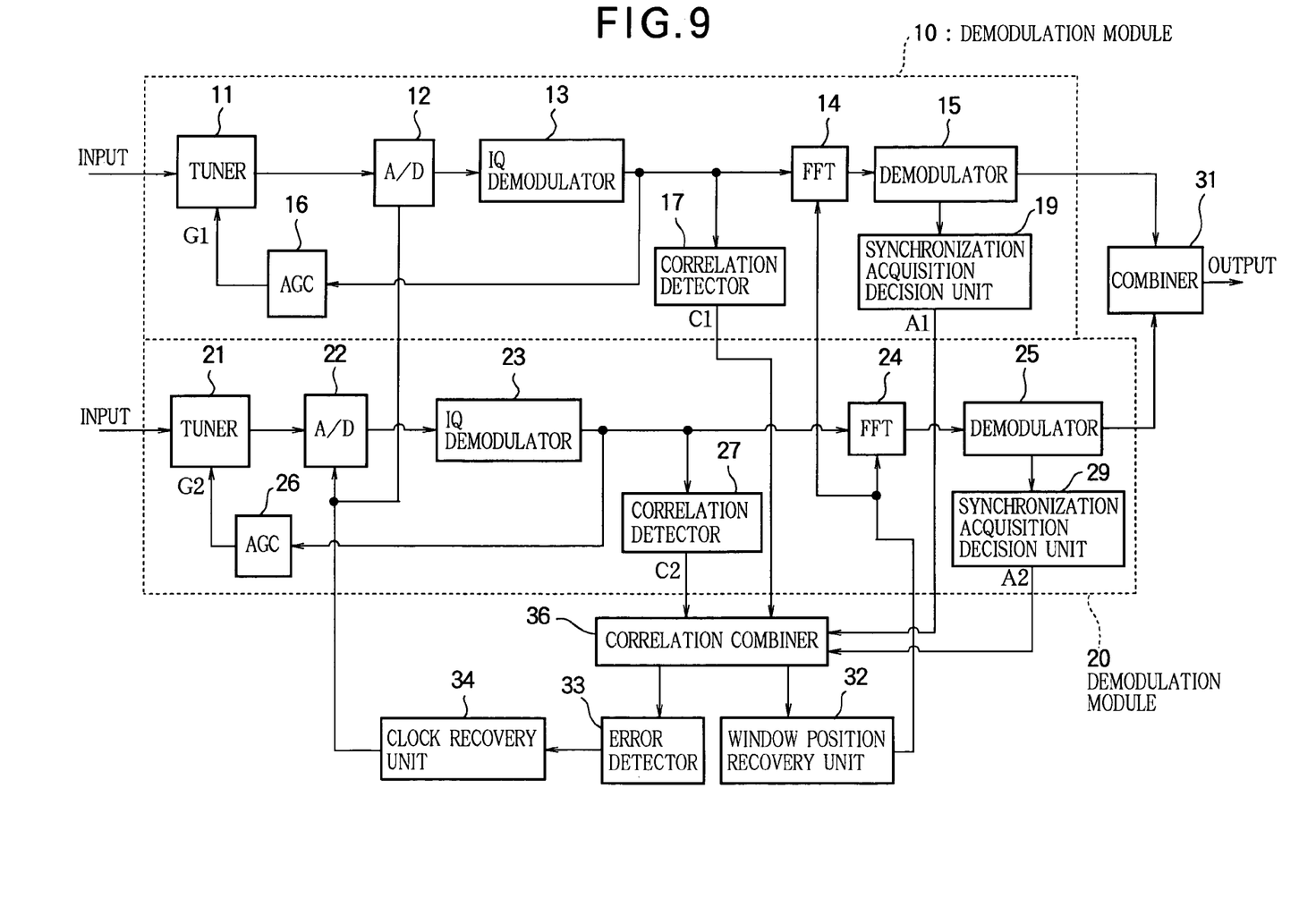
FIG. 9 is a block diagram showing a demodulator in a third embodiment of this invention.

FIG. 9 is a block diagram showing the structure of a demodulator in a third embodiment of this invention, which is configured for diversity reception with two demodulation modules 10, 20 as in the first and second embodiments.

The structure of the demodulator shown in FIG. 9 is generally similar to the structures shown in FIGS. 1 and 5, but is equipped with synchronization acquisition decision units 19, 29, on the assumption that the transmitted OFDM signal includes a known synchronization signal. The synchronization acquisition decision units 19, 29 determine whether acquisition of synchronization with the OFDM signal has succeeded or not by determining whether the known synchronization signal can be correctly demodulated in each module or not, and output resulting synchronization acquisition decision values A1, A2. The correlation waveforms detected by the correlation detectors 17, 27 and the synchronization acquisition decision values output from the synchronization acquisition decision units 19, 29 are supplied to a correlation combiner 37.

In the correlation combiner 37, the correlation waveforms are combined as follows: the coefficient for the correlation waveform from each demodulation module that outputs a value indicating successful acquisition of synchronization with the OFDM signal, among the synchronization acquisition decision values A1, A2 supplied from the synchronization acquisition decision units 19, 28, is set to the reciprocal of the number of modules that output values indicating successful synchronization acquisition and the coefficient for the correlation waveform output from each demodulation module that outputs a value indicating unsuccessful synchronization acquisition is set to '0', unless all the demodulation modules output values indicating unsuccessful synchronization acquisition, in which case the coefficients for the correlation waveforms output from all the demodulation modules are set to the reciprocal of the total number of demodulation modules; the correlation waveforms supplied from each module are multiplied by these set coefficient values; and the correlation waveforms obtained as a result of these multiplication operations are added together, thereby combining the waveforms. The combined correlation waveform is supplied to the clock error detector 33 and FFT window position recovery unit 32, which carry out FFT window position recovery and clock recovery.

Figure 10:
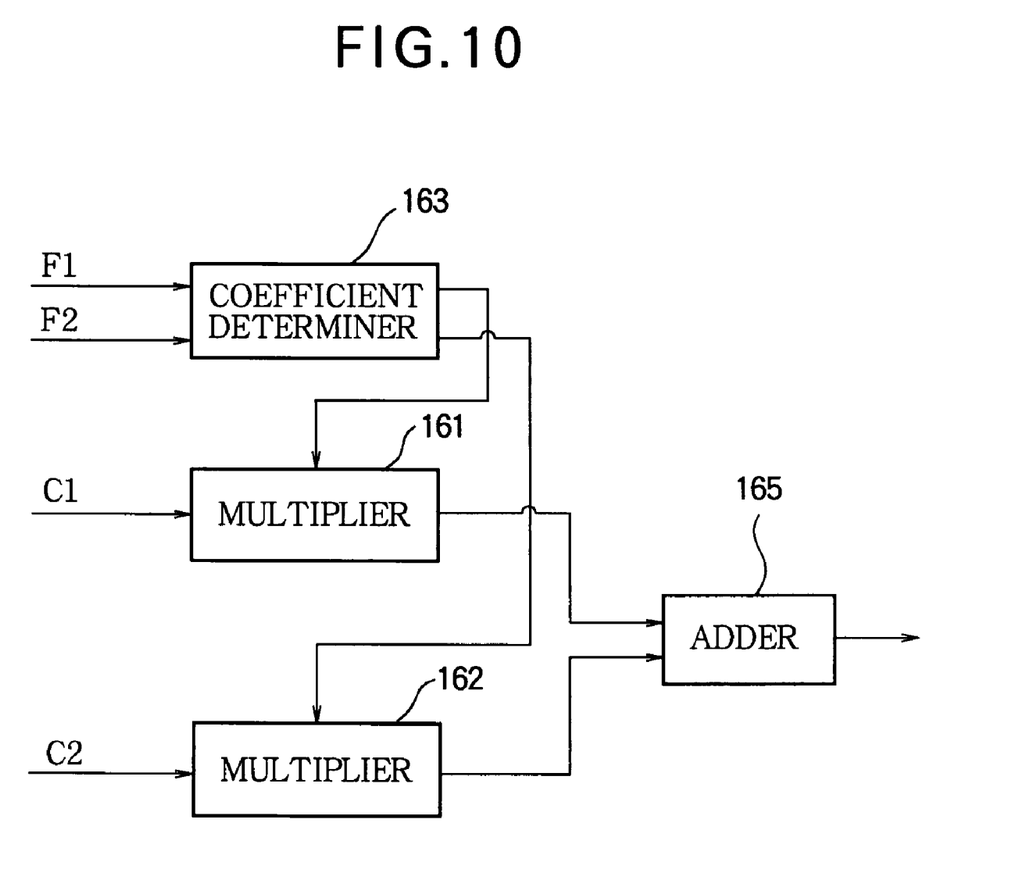
FIG. 10 is a block diagram showing an example of the correlation combiner used in the third embodiment.

A specific example of this type of correlation combiner 37 is shown in FIG. 10. The correlation combiner 37 shown in FIG. 10 comprises multipliers 161, 162 corresponding to the demodulation modules 10, 20, a coefficient determiner 163, and an adder 165.

The multipliers 161, 162 receive the correlation waveforms C1, C2 from the correlation detectors 17, 27 in the demodulation modules 10, 20 and multiply these waveforms C1, C2 by coefficients supplied from the coefficient determiner 163. The coefficient determiner 163 receives the synchronization acquisition decision values A1, A2 from the synchronization acquisition decision units 19, 29 in the demodulation modules 10, 20. If both synchronization acquisition decision values A1, A2 indicate successful synchronization acquisition, the coefficients used in the multipliers 161, 162 are both set to ½. If one synchronization acquisition decision value (for example, the synchronization acquisition decision value A1) indicates successful synchronization acquisition and the other value indicates unsuccessful synchronization acquisition, the coefficient used in the multiplier (161) corresponding to the synchronization acquisition decision unit that outputs a value indicating successful synchronization acquisition is set to '1' and the coefficient used in the other multiplier (162) is set to '0'. If the synchronization acquisition decision values A1, A2 both indicate unsuccessful synchronization acquisition, the coefficients used in the multipliers 161, 162 are both set to ½.

The multipliers 161, 162 carry out multiplication using the coefficients set by the coefficient determiner 163. The adder 165 adds the outputs of the multipliers 161, 162 together and outputs the sum as a combined correlation waveform.

Two demodulation modules (10, 20) are provided in the above example, but the number of demodulation modules may be three or more. In this case as well, the correlation combiner 37 can be configured as above. Generally speaking, when there are n demodulation modules (where n is an integer equal to or greater than two), the correlation combiner 37 comprises first to n-th multipliers corresponding to respective demodulation modules, a coefficient determiner, and an adder. The first to n-th multipliers receive the correlation waveforms from the correlation detectors in the respective demodulation modules and multiply these waveforms by the coefficients supplied from the coefficient determiner. The coefficient determiner receives the synchronization acquisition decision values from the synchronization acquisition decision units in the demodulation modules, determines whether the synchronization acquisition decision values indicate the successful synchronization acquisition, and obtains the number m of demodulation modules in which the synchronization acquisition decision values indicate the successful synchronization acquisition. If the number m is greater than or equal to one, the coefficients used in the multipliers corresponding to the demodulation modules in which the synchronization acquisition decision values indicate successful synchronization acquisition are set to 1/m, and the coefficients used in the multipliers corresponding to the demodulation modules in which the synchronization acquisition decision values indicate unsuccessful synchronization acquisition are set to '0'. If the number m is zero, then the coefficients used in the first to n-th multipliers are all set to 1/n.

The first to n-th multipliers carry out multiplication using the coefficients set by the coefficient determiner. The adder sums the outputs of the first to n-th multipliers and outputs the sum as a combined correlation waveform.

In the above example, whether the synchronization acquisition decision values indicate successful synchronization acquisition is determined. Alternatively, whether some other condition is satisfied may be determined, and coefficients may be determined according to the result. The coefficients used in the multipliers may also be set to positive non-zero values other than '1/m' and '1/n'.

In the first embodiment, the correlation waveforms are combined according to the gain values represented by the AGC control signals supplied from the AGC units 16, 26 shown in FIG. 1. In the second embodiment, the correlation waveforms are combined according to the C/N values supplied from the C/N detectors 18, 28 shown in FIG. 5. In the third embodiment, the correlation waveforms are combined according to the synchronization acquisition decision values supplied from the synchronization acquisition decision units 19, 29 shown in FIG. 9. These embodiments have been described separately, but the correlation waveforms may also be combined according to combined information including the gain values represented by the AGC control signals, the C/N values, and the synchronization acquisition decision values by, for example, providing all of the above AGC units, C/N detectors, and synchronization acquisition decision units.

A demodulator has been described above, but the same effect as above can be obtained in a receiver including the above-described demodulator as a component. This type of receiver also constitutes part of the present invention. Further, the demodulation method for the above-described demodulator also constitutes part of the invention.

INDUSTRIAL APPLICABILITY

The invention can be applied, for example, to receivers used in digital terrestrial broadcasting and wireless LANs.

What is claimed is:
1. A demodulator comprising:
a plurality of demodulation modules, each receiving an OFDM signal in which a symbol interval consists of a guard interval and a valid symbol interval and demodulating the OFDM signal to extract symbol data, and
a combiner for combining the demodulated data output from the plurality of demodulation modules and generating combined demodulated data,
wherein each of the plurality of the demodulation modules comprises:
an AGC unit for generating an AGC control signal for adjusting a magnitude of the received signal to specific level; and a correlation detector for detecting a correlation between a complex-valued baseband OFDM signal that has been gain-adjusted by the AGC unit and a signal obtained by delaying the complex-valued baseband OFDM signal by one valid symbol interval to generate a correlation waveform signal representing the detected correlation;

the demodulator further comprising a correlation combiner that generates a combined correlation signal by combining the correlation waveform signals output from the correlation detectors in the plurality of demodulation modules;

the correlation combiner multiplying the correlation waveform signals by coefficients calculated from gain values represented by the AGC control signals output from the respective AGC units in the plurality of demodulation modules and adding the resulting products together to generate the combined correlation signal.

2. The demodulator of claim 1, wherein the correlation combiner generates the combined correlation signal by calculating a value inversely proportional to the gain value represented by the AGC control signal supplied from the AGC unit in each of the plurality of demodulation modules, multiplying the correlation waveform signal supplied from the correlation detector in each of the plurality of the demodulation modules by the corresponding calculated value as a coefficient, and adding the resulting products together.

3. The demodulator of claim 1, wherein the correlation combiner generates the combined correlation signal by setting the coefficient of the correlation waveform signal output from the demodulation module that outputs the minimum value among the gain values represented by the AGC control signals supplied from the AGC unit in each of the plurality of demodulation modules to one and the coefficients of the correlation waveform signals output from the other demodulation modules to zero, multiplying the correlation waveform signals supplied from the demodulation modules by the set values, and adding the resulting products together.

4. The demodulator of claim 1, wherein the correlation combiner generates the combined correlation signal by setting the coefficient of the correlation waveform signal output from each of the plurality of demodulation modules that outputs a value that satisfies a predetermined condition among the gain values represented by the AGC control signals supplied from the AGC unit in each of the plurality of the demodulation modules to a value greater than zero and the coefficient of the correlation waveform signal output from each of the plurality of the demodulation modules that outputs a value that does not satisfy the predetermined condition to zero unless all the demodulation modules output values that do not satisfy the predetermined condition, in which case the coefficients for the correlation waveform signals output from all the demodulation modules are set to a value greater than zero, multiplying the correlation waveform signal supplied from each of the plurality of the demodulation modules by the set value, and adding the resulting products together.

5. The demodulator of claim 1, further comprising a clock recovery unit for generating a clock signal, wherein:

each of the plurality of the demodulation modules further comprises a tuner for converting the frequency of the received signal and an A/D converter for converting the output of the tuner to a digital signal in synchronization with the clock signal and outputting the digital signal; and the clock recovery unit detects frequency error and phase error in the clock signal according to the combined correlation waveform signal output from the correlation combiner and controls the frequency and the phase so as to reduce the error.

6. The demodulator of claim 5, further comprising a window position recovery unit for generating a window position signal, wherein each of the plurality of the demodulation modules comprises:

an IQ demodulator for converting the output of the A/D converter to a complex-valued baseband signal; and a fast Fourier transform unit for receiving the output of the IQ demodulator, capturing data at each window position according to the window position signal, and performing a fast Fourier transform; wherein the window position recovery unit generates the window position signal according to the combined correlation waveform signal output from the correlation combiner.

7. A receiver including the demodulator of claim 1.

8. A demodulator comprising:

a plurality of demodulation modules, each receiving an OFDM signal in which a symbol interval consists of a guard interval and a valid symbol interval and demodulating the OFDM signal to extract symbol data, and a combiner for combining the demodulated data output from the plurality of demodulation modules and generating combined demodulated data, wherein each of the plurality of demodulation modules comprises:

an AGC unit for generating an AGC control signal for adjusting a magnitude of the received signal to a specific level;

a C/N detector for detecting a C/N value, the C/N value being a power ratio between an actually demodulated signal and an error in the actually demodulated signal with respect to an expected demodulated signal; and a correlation detector for detecting a correlation between a complex-valued baseband OFDM signal that has been gain-adjusted by the AGC unit and a signal obtained by delaying the complex-valued baseband OFDM signal by one valid symbol interval to generate a correlation waveform signal representing the detected correlation;

the demodulator further comprising a correlation combiner that generates a combined correlation signal by combining the correlation waveform signals output from the correlation detectors in the plurality of demodulation modules;

the correlation combiner multiplying the correlation waveform signals by coefficients calculated from the C/N values detected by the respective C/N detectors in the plurality of demodulation modules and adding the resulting products together to generate the combined correlation signal.

9. The demodulator of claim 8, wherein the correlation combiner generates the combined correlation signal by calculating a value proportional to the C/N value supplied from the C/N detector in each of the plurality of demodulation modules, multiplying the correlation waveform signal supplied from the correlation detector in each of the plurality of the demodulation modules by the corresponding calculated value as a coefficient, and adding the resulting products together.

10. The demodulator of claim 8, wherein the correlation combiner generates the combined correlation signal by setting the coefficient of the correlation waveform signal output from the demodulation module that outputs the maximum value among the C/N values supplied from the C/N detector in each of the plurality of demodulation modules to one and the coefficients of the correlation waveform signals output from the other demodulation modules to zero, multiplying the correlation waveform signals supplied from the demodulation modules by the set values, and adding the resulting products together.

11. The demodulator of claim 8, wherein the correlation combiner generates the combined correlation signal by setting the coefficient of the correlation waveform signal output from each of the plurality of demodulation modules that outputs a value that satisfies a predetermined condition among the C/N values supplied from the C/N detector in each of the plurality of the demodulation modules to a value greater than zero and the coefficient of the correlation waveform signal output from each of the plurality of the demodulation modules that outputs a value that does not satisfy the predetermined condition to zero unless all the demodulation modules output values that do not satisfy the predetermined condition, in which case the coefficients for the correlation waveform signals output from all the demodulation modules are set to a value greater than zero, multiplying the correlation waveform signal supplied from each of the plurality of the demodulation modules by the set value, and adding the resulting products together.

12. The demodulator of claim 8, further comprising a clock recovery unit for generating a clock signal, wherein:
each of the plurality of the demodulation modules further comprises a tuner for converting the frequency of the received signal and an A/D converter for converting the output of the tuner to a digital signal in synchronization with the clock signal and outputting the digital signal; and
the clock recovery unit detects frequency error and phase error in the clock signal according to the combined correlation waveform signal output from the correlation combiner combining means and controls the frequency and the phase so as to reduce the error.

13. The demodulator of claim 12, further comprising a window position recovery unit for generating a window position signal, wherein each of the plurality of the demodulation modules comprises:
an IQ demodulator for converting the output of the A/D converter to a complex-valued baseband signal; and
a fast Fourier transform unit for receiving the output of the IQ demodulator, capturing data at each window position according to the window position signal, and performing a fast Fourier transform; wherein
the window position recovery unit generates the window position signal according to the combined correlation waveform signal output from the correlation combiner.

14. A receiver including the demodulator of claim 8.

15. A demodulator comprising;
a plurality of demodulation modules, each receiving an OFDM signal in which a symbol interval consists of a guard interval and a valid symbol interval and demodulating from the OFDM signal to extract symbol data, and
a combiner for combining the demodulated data output from the plurality of demodulation modules and generating combined demodulated data,
wherein each of the plurality of the demodulation modules comprises:
an AGC unit for generating an AGC control signal for adjusting the magnitude of the received signal to specific level;
a synchronization acquisition decision unit for determining whether acquisition of synchronization with the OFDM signal has succeeded or not and outputting a synchronization acquisition decision value as a determination result; and a correlation detector for detecting a correlation between a complex-valued baseband OFDM signal that has been gain-adjusted by the AGC unit and a signal obtained by delaying the complex-valued baseband OFDM signal by one valid symbol interval to generate a correlation waveform signal representing the detected correlation;
the demodulator further comprising a correlation combiner that generates a combined correlation signal by combining the correlation waveform signals output from the correlation detectors in the plurality of demodulation modules;
the correlation combiner multiplying the correlation waveform signals by coefficients calculated from the synchronization acquisition decision values output from the respective synchronization acquisition decision units in the plurality of demodulation modules and adding the resulting products together to generate the combined correlation signal.

16. The demodulator of claim 15, wherein the correlation combiner generates the combined correlation signal by setting the coefficient of the correlation waveform signal output from each of the plurality of demodulation modules that outputs a value indicating successful synchronization acquisition among the synchronization acquisition decision values supplied from the synchronization acquisition decision units in the demodulation modules to a value greater than zero and the coefficient of the correlation waveform signal output from each of the plurality of the demodulation modules that outputs a value indicating unsuccessful synchronization acquisition to zero unless all the demodulation modules output values indicating the unsuccessful synchronization acquisition, in which case the coefficients for the correlation waveform signals output from all the demodulation modules are set to a value greater than zero, multiplying the correlation waveform signal supplied from each of the plurality of the demodulation modules by the set value, and adding the resulting products together.

17. The demodulator of claim 15, further comprising a clock recovery unit for generating a clock signal, wherein:
each of the plurality of the demodulation modules further comprises a tuner for converting the frequency of the received signal and an A/D converter for converting the output of the tuner to a digital signal in synchronization with the clock signal and outputting the digital signal; and
the clock recovery unit detects frequency error and phase error in the clock signal according to the combined correlation waveform signal output from the correlation combiner and controls the frequency and the phase so as to reduce the error.

18. The demodulator of claim 17, further comprising a window position recovery unit for generating a window position signal, wherein each of the plurality of the demodulation modules comprises:
an IQ demodulator for converting the output of the A/D converter to a complex-valued baseband signal; and
a fast Fourier transform unit for receiving the output of the IQ demodulator, capturing data at each window position according to the window position signal, and performing a fast Fourier transform; wherein
the window position recovery unit generates the window position signal according to the combined correlation waveform signal output from the correlation combiner.

19. A receiver including the demodulator of claim 15.

20. A demodulation method having comprising:
a plurality of demodulation steps, each including receiving an OFDM signal in which a symbol interval consists of a guard interval and a valid symbol interval and demodulating the OFDM signal to extract symbol data, and a combining step for combining the demodulated data obtained in the plurality of demodulation steps and generating combined demodulated data, wherein each of the plurality of the demodulation steps comprises:

an AGC step for generating an AGC control signal for adjusting the magnitude of the received signal to a specific level; and a correlation detection step for detecting a correlation between a complex-valued baseband OFDM signal that has been gain-adjusted by the AGC step and a signal obtained by delaying the complex-valued baseband OFDM signal by one valid symbol interval to generate a correlation waveform signal representing the detected correlation;

the method further comprising a correlation combining step that generates a combined correlation signal by combining the correlation waveform signals output from the correlation detection steps in the plurality of demodulation steps;

the correlation combining step including multiplying the correlation waveform signals by coefficients calculated from gain values represented by the AGC control signals output from the respective AGC steps in the plurality of demodulation steps and adding the resulting products together to generate the combined correlation signal.

21. A demodulation method comprising:

a plurality of demodulation steps, each including receiving an OFDM signal in which a symbol interval consists of a guard interval and a valid symbol interval and demodulating the OFDM signal to extract symbol data, and a combining step for combining the demodulated data obtained in the plurality of demodulation steps and generating combined demodulated data, wherein each of the plurality of the demodulation steps comprises:

an AGC step for generating an AGC control signal for adjusting the magnitude of the received signal to a specific level; and a C/N value detection step for detecting a C/N value, the C/N value being a power ratio between an actually demodulated signal and an error in the actually demodulated signal with respect to an expected demodulation signal; and a correlation detection step for detecting a correlation between a complex-valued baseband OFDM signal that has been gain-adjusted by the AGC step and a signal obtained by delaying the complex-valued baseband OFDM signal by one valid symbol interval to generate a correlation waveform signal representing the detected correlation;

the method further comprising a correlation combining step that generates a combined correlation signal by combining the correlation waveform signals output from the correlation detection steps in the plurality of demodulation steps;

the correlation combining step multiplying the correlation waveform signals by coefficients calculated from the C/N values detected by the respective C/N value detection steps in the plurality of demodulation steps and adding the resulting products together to generate the combined correlation signal.

22. A demodulation method comprising:

a plurality of demodulation steps, each including receiving an OFDM signal in which a symbol interval consists of a guard interval and a valid symbol interval and demodulating the OFDM signal to extract symbol data, and a combining step for combining the demodulated data obtained in the plurality of demodulation steps and generating combined demodulated data, wherein each of the plurality of the demodulation steps comprises:

an AGC step for generating an AGC control signal for adjusting the magnitude of the received signal to a specific level;

a synchronization acquisition decision step for determining whether acquisition of synchronization with the OFDM signal has succeeded or not and outputting a synchronization acquisition decision value as a determination result; and a correlation detection step for detecting a correlation between a complex-valued baseband OFDM signal that has been gain-adjusted by the AGC step and a signal obtained by delaying the complex-valued baseband OFDM signal for by one valid symbol interval to generate a correlation waveform signal representing the detected correlation;

the method further comprising a correlation combining step that generates a combined correlation signal by combining the correlation waveform signals output from the correlation detection steps in the plurality of demodulation steps;

the correlation combining step multiplying the correlation waveform signals by coefficients calculated from the synchronization acquisition decision values output from the respective synchronization acquisition decision steps in the plurality of demodulation steps and adding the resulting products together to generate the combined correlation signal.

* * * * *